(12) United States Patent
Lee et al.

(10) Patent No.: US 11,063,110 B2
(45) Date of Patent: Jul. 13, 2021

(54) CONDUCTIVE PATTERN WITH TAPERED ANGLE, DISPLAY DEVICE INCLUDING THE SAME, AND METHOD OF MANUFACTURING CONDUCTIVE PATTERN

(71) Applicant: Samsung Display Co., Ltd., Yongin-si (KR)

(72) Inventors: Joon Geol Lee, Wanju-Gun (KR); Kyeong Su Ko, Hwaseong-si (KR); Sang Won Shin, Yongin-si (KR); Dong Min Lee, Anyang-si (KR); Sang Gab Kim, Seoul (KR); Sang Woo Sohn, Yongin-si (KR); Hyun Eok Shin, Gwacheon-si (KR); Shin Il Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 103 days.

(21) Appl. No.: 16/164,796

(22) Filed: Oct. 19, 2018

(65) Prior Publication Data
US 2019/0165083 A1    May 30, 2019

(30) Foreign Application Priority Data

Nov. 28, 2017    (KR) .......................... 10-2017-0160172

(51) Int. Cl.
*H01L 27/32* (2006.01)
*H01L 27/12* (2006.01)
(Continued)

(52) U.S. Cl.
CPC ...... *H01L 27/3279* (2013.01); *H01L 23/5283* (2013.01); *H01L 23/53223* (2013.01);
(Continued)

(58) Field of Classification Search
CPC ............ H01L 27/3279; H01L 27/1244; H01L 23/5283; H01L 51/56; H01L 23/53219–53223
See application file for complete search history.

(56) References Cited

U.S. PATENT DOCUMENTS

| 5,350,948 A * | 9/1994 | Maehara | ............. H01L 23/5226 |
| | | | 257/763 |
| 6,297,161 B1 * | 10/2001 | Sah | ........................ H01L 29/458 |
| | | | 257/E21.414 |

(Continued)

FOREIGN PATENT DOCUMENTS

| EP | 1796171 | 6/2007 |
| KR | 10-1999-0056337 | 7/1999 |

OTHER PUBLICATIONS

Extended European Search Report dated Mar. 27, 2019, issued in European Patent Application No. 18208715.5.

(Continued)

*Primary Examiner* — Allen L Parker
*Assistant Examiner* — Gustavo G Ramallo
(74) *Attorney, Agent, or Firm* — H.C. Park & Associates, PLC

(57) ABSTRACT

A conductive pattern for a display device includes a first layer including aluminum or an aluminum alloy disposed on a substrate and forming a first taper angle with the substrate, and a second layer disposed on the first layer forming a second taper angle with the first layer, in which the second taper angle is smaller than the first taper angle.

19 Claims, 10 Drawing Sheets

(51) Int. Cl.
*H01L 51/56* (2006.01)
*H01L 23/528* (2006.01)
*H01L 23/532* (2006.01)
*G02F 1/1362* (2006.01)

(52) U.S. Cl.
CPC .......... *H01L 27/1244* (2013.01); *H01L 51/56* (2013.01); *G02F 1/13629* (2021.01)

(56) References Cited

U.S. PATENT DOCUMENTS

| | | | |
|---|---|---|---|
| 8,203,264 B2 | 6/2012 | Kang et al. | |
| 2003/0038369 A1* | 2/2003 | Layadi | H01L 23/485 257/750 |
| 2004/0041204 A1* | 3/2004 | Ireland | H01L 21/32051 257/319 |
| 2004/0253807 A1* | 12/2004 | Thei | H01L 21/76846 438/627 |
| 2005/0045887 A1* | 3/2005 | Kang | H01L 27/12 257/66 |
| 2005/0245087 A1* | 11/2005 | Sasagawa | H01L 21/32136 438/706 |
| 2008/0061029 A1* | 3/2008 | Lai | B81C 1/00626 216/37 |
| 2009/0134392 A1* | 5/2009 | Jeong | H01L 51/5209 257/59 |
| 2010/0163877 A1 | 7/2010 | Hino et al. | |
| 2010/0200906 A1* | 8/2010 | Kidoh | H01L 27/11578 257/324 |
| 2014/0175432 A1 | 6/2014 | Yamazaki et al. | |
| 2015/0295092 A1 | 10/2015 | Misaki | |

OTHER PUBLICATIONS

Wu et al., "Novel Multilayered Ti/TiN Diffusion Barrier for Al Metallization", Journal of Electronic Materials, Aug. 2005, vol. 34, No. 8, available at https://ir.nctu.edu.tw/bitstream/11536/13464/1/000231052800010.pdf.

* cited by examiner

CONDUCTIVE PATTERN WITH TAPERED ANGLE, DISPLAY DEVICE INCLUDING THE SAME, AND METHOD OF MANUFACTURING CONDUCTIVE PATTERN

CROSS-REFERENCE TO RELATED APPLICATION

This application claims priority from and the benefit of Korean Patent Application No. 10-2017-0160172, filed on Nov. 28, 2017, which is hereby incorporated by reference for all purposes as if fully set forth herein.

BACKGROUND

Field

Exemplary implementations of the invention relate generally to a conductive pattern, a display device including the same, and a method of manufacturing a conductive pattern.

Discussion of the Background

Electronic devices generally employ a conductive pattern, such as wirings or electrodes, to transmit signals. For example, a display device, such as an organic light emitting display device or a liquid crystal display device, may include a plurality of conductive patterns for driving a thin film transistor (TFT). When the length of a signal wiring is increased, however, a signal delay may occur due to the internal resistance of the signal wiring. Delay of a scanning signal in a high-resolution display device may deteriorate display quality due to difficulties in securing a sufficient gate-on time.

Accordingly, efforts have been made to form a conductive pattern with a low-resistance material. However, signal wirings may be exposed to various environments during manufacture. For example, an annealing process, an etching process, or the like may cause damage to the material of the signal wiring. As such, even when the signal wiring includes a low-resistance material well known in the art, it is generally difficult to secure process reliability when the low-resistance material is directly used as a conductive pattern.

The above information disclosed in this Background section is only for understanding of the background of the inventive concepts, and, therefore, it may contain information that does not constitute prior art.

SUMMARY

Display devices constructed according to exemplary implementations of the invention include a low-resistance conductive pattern having excellent reliability. In addition, methods according to exemplary implementations of the invention are capable of providing a low-resistance conductive pattern with excellent reliability.

According to some exemplary embodiments, the capping layer may be formed of multiple component layers and a first capping component layer disposed on the main conductive layer is made of titanium nitride, thereby preventing or mitigating the diffusion of the metal components at the interface with the main conductive layer as compared to when the first capping component layer is made of titanium. Further, since titanium nitride does not easily react with fluoric acid or the like compared to titanium, the surface of the main conductive layer may be protected during a cleaning process to reduce or prevent surface damage.

According to some exemplary embodiments, the capping layer may effectively prevent the damage of the main conductive layer from a cleaning process or an etching process while forming the main conductive layer with a low-resistance material, such as aluminum or an aluminum alloy. Since the taper angle of the capping layer is relatively small, it is possible to prevent the insulating material from not being charged (or filled) in the vicinity of the side surface of the conductive pattern, or prevent a film disposed on the conductive pattern from being non-uniform.

According to some exemplary embodiments, when the taper angles of multiple capping component layers gradually decrease from the lower toward the upper layer and an insulating film or the like is formed on the conductive pattern, the insulating material may even more be filled in the side surface of the conductive pattern, which may improve the film quality of the insulating film.

The principles and exemplary embodiments of the invention are particularly advantageous when implemented in display devices, such as high resolution, organic light emitting diode display devices. When display devices include a conductive pattern according to exemplary embodiments, signal delay may be significantly reduced due to the low resistance of the pattern, thereby improving display quality.

According to an exemplary embodiment, a conductive pattern for a display device includes a first layer including aluminum or an aluminum alloy disposed on a substrate and forming a first taper angle with the substrate, and a second layer disposed on the first layer forming a second taper angle with the first layer, in which wherein the second taper angle is smaller than the first taper angle.

The second layer may include a first component layer disposed on the first layer and including titanium nitride, and a second component layer disposed on the first component layer and including titanium.

The second layer may further include a third component layer disposed on the second component layer and including titanium nitride, and a fourth component layer disposed on the third component layer and including titanium.

The first component layer may have a thickness in a range of about 150 Å to about 400 Å, and each of the second component layer, the third component layer, and the fourth component layer may have a thickness in a range of about 50 Å to about 200 Å.

The second layer may have a thickness of at least about 800 Å.

The second layer may further include a fifth component layer disposed on the fourth component layer and including titanium nitride.

A thickness the fifth component layer may be less than a thickness of each of the first to fourth capping component layers.

An atomic ratio of nitrogen to titanium of the first component layer may be in a range of about 0.9 to about 1.2.

The first layer may include a plurality of sequentially laminated component layers, and a taper angle of each of the component layers may be substantially the same or progressively decreases in a direction away from the first layer.

The taper angle of the first layer may be less than about 60°.

The taper angle of the second layer may be less than about 50°.

The second layer may include a tantalum layer and a titanium layer alternately laminated with each other, and a top surface of the first layer may contact the tantalum layer.

The first layer may include a conductive layer, and the second layer may include a capping layer.

At least one of the first and second component layers may include a tip or undercut portion at a side portion thereof.

According to an exemplary embodiment, a display device includes a substrate, a thin film transistor disposed on the substrate, and a conductive pattern connected to the thin film transistor. The conductive pattern includes a first layer including aluminum or an aluminum alloy and forming a first taper angle with the substrate, and a second layer disposed on the first layer and forming a second taper angle smaller than the first taper angle.

The second layer may include a first component layer disposed on the first layer and including titanium nitride, a second component layer disposed on the first component layer and including titanium, a third component layer disposed on the second component layer and including titanium nitride, and a fourth component layer disposed on the third component layer and including titanium.

The first layer may have a thickness of at least about 800 Å, the first component layer may have a thickness in a range of about 150 Å to about 400 Å, and each of the second component layer, the third component layer, and the fourth component layer may have a thickness in a range of about 50 Å to about 200 Å.

The first taper angle may be less than about 60°, and the second taper angle may be less than about 50 the first taper angle is less than about 60°, and the second taper angle is less than about 50°.

The conductive pattern may include at least one of a scan signal line to transmit a scan signal to the thin film transistor and a data signal line to transmit a data signal to the thin film transistor.

According to an exemplary embodiment, a method of manufacturing a conductive pattern for a display device includes the steps of: forming a conductive layer including aluminum or an aluminum alloy; forming a capping layer on the conductive layer; forming a photoresist pattern on the capping layer; etching the capping layer and the conductive layer under a first condition; and etching the capping layer and the conductive layer under a second condition, in which the first condition has a higher etching rate for the capping layer and the conductive layer than the second condition, and a lower consumption rate for the photoresist pattern than the second condition.

A first etchant may be used for etching under the first condition, a second etchant may be used for etching under the second condition, and each of the first etchant and the second etchant may include chlorine and boron chloride.

The amount of chlorine in the first etchant may be greater than that in the second etchant, and the amount of boron chloride in the first etchant may be less than that in the second etchant.

Each of the first etchant and the second etchant may further include nitrogen, and the amount of nitrogen in the first etchant may be less than that in the second etchant.

The step of forming the capping layer may further include the steps of: forming a first layer including titanium nitride on the conductive layer; and forming a second layer including titanium on the first layer.

The step of forming the first layer and the forming layer may be continuously performed in the same sputtering apparatus.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 10 is a cross-sectional view of a conductive pattern according to an exemplary embodiment of the invention.

DETAILED DESCRIPTION OF THE EMBODIMENTS

Figure 1:
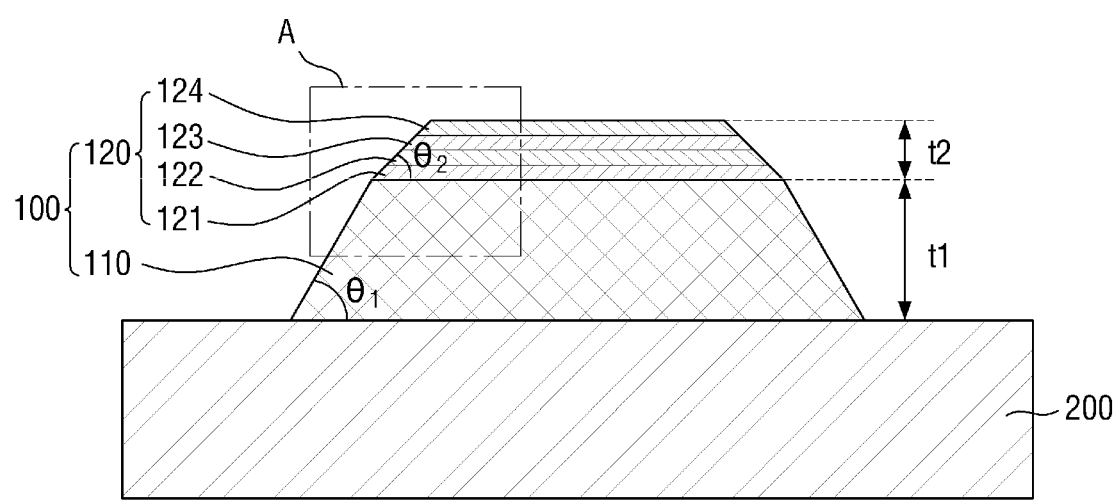
FIG. 1 is a cross-sectional view of an exemplary embodiment of a conductive pattern constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalties between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order.

For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a cross-sectional view of an exemplary embodiment of a conductive pattern constructed according to the principles of the invention.

Referring to FIG. 1, a conductive pattern 100 may be disposed on a base member 200. The base member 200 provides a space on which the conductive pattern 100 is disposed, and may include various materials. For example, the base member 200 may be an insulating substrate made of an inorganic material, such as glass or quartz, or an insulating substrate made of an organic material, such as polyimide. As another example, the base member 200 may be an inorganic insulating film, such as a silicon oxide film, a silicon nitride film, or a silicon oxynitride film, or may be an organic insulating film. As another example, the base member 200 may be a layer (or a film) made of a semiconductor material, such as polysilicon or an oxide semiconductor, or a conductive material, such as metal.

The conductive pattern 100 may have conductivity, as a whole, and may have a specific planar shape. The conductive pattern 100 may be used in various electronic devices. For example, the conductive pattern 100 may be used as an electrode, a floating electrode, or the like, as well as a wiring for transmitting an electrical signal. The conductive pattern 100 may be used as a gate wiring, a data wiring, or a signal connecting wiring of a thin film transistor, and may also be used as a gate electrode, a source electrode, and a drain electrode. Further, the conductive pattern 100 may be applied to a power supply voltage line, anode electrode, cathode electrode, auxiliary electrode, or holding capacitor electrode of an organic light emitting display device, and may also be applied to a pixel electrode, common electrode, holding capacitor wiring, or holding capacitor electrode of a liquid crystal display device. Moreover, the conductive pattern 100 may be used as a light blocking pattern or a reflective pattern.

The conductive pattern 100 includes a main conductive layer 110 and a capping layer 120 disposed on the main conductive layer 110.

The main conductive layer 110 may be a layer providing conductivity to the conductive pattern 100. The main conductive layer 110 may include a low-resistance material. For example, the main conductive layer 110 may include aluminum (Al) or an aluminum alloy, which includes aluminum and an additive material. The additive material may include at least one of nickel (Ni), lanthanum (La), neodymium (Nd), and germanium (Ge). The additive material may be about 2 at % or less, or 1 at % or less, of total amount of the aluminum alloy, but the inventive concepts are not limited thereto.

Since aluminum is a relatively low-resistance material having a surface resistance of about 0.15Ω/□ (based on thickness of 3 kÅ), which is lower than that of molybdenum (Mo) as it has a surface resistance of about 0.55Ω/□ (based on thickness of 2.5 kÅ), a conductive layer including aluminum or an aluminum alloy may have a sufficient level of conductivity even when the conductive layer is formed thinly with a small thickness.

The thickness t1 of the main conductive layer 110 may be, for example, in a range of about 1000 Å to about 3000 Å, or about 1500 Å to about 2000 Å. However, the inventive concepts are not limited thereto.

The main conductive layer 110 may be a single-layer film or a multilayer film. When the main conductive layer 110 is a multilayer film, at least one of the layers of the multilayer film may include aluminum or an aluminum alloy.

The capping layer 120 is disposed on the top surface of the main conductive layer 110. The capping layer 120 covers the top surface of the main conductive layer 110 to protect the main conductive layer 110. As described above, the main conductive layer 110 may include aluminum, which is vulnerable to forming a hillock or the like. More particularly, when a wiring is formed by disposing a layer on an aluminum single layer, one or more hillocks may be generated on the surface of an aluminum wiring during a high temperature (for example, 400° C. to 580° C.) annealing process. Further, when an insulating film is formed on an aluminum wiring and a contact hole exposing the aluminum wiring is formed in the insulating film, the surface of the aluminum wiring may be exposed to an etching material or plasma for forming the contact hole. In this case, the surface of the aluminum wiring may be damaged or the resistance thereof may be increased. As such, the capping layer 120 constructed according to the principles of the invention may prevent or mitigate defects on the surface of the main conductive layer 110 and/or prevent increase in the resistance of the main conductive layer 110, thereby increasing the reliability of the conductive pattern 100.

The capping layer 120 may have a multilayer structure, in which layers of different materials are laminated. Specifically, the capping layer 120 may include a plurality of laminated layers. As used herein, the layer(s) forming the capping layer 120 will be referred to as a capping component layer in order to distinguish it from the capping layer 120. The neighboring capping component layers may include different materials from each other. The capping layer 120 includes two or more capping component layers. FIG. 1 illustrates a capping layer 120 having four capping component layers 121 to 124, however, the inventive concepts are not limited thereto, and the capping layer 120 may include four or more capping component layers.

Each of the capping component layers 121 to 124 forming the multilayer structure of the capping layer 120 may include a conductive material. Each of the capping component layers 121 to 124 may include, for example, titanium (Ti), titanium nitride (TiN), tantalum (Ta), or the like. For example, the capping layer 120 may have a structure in which a titanium nitride layer and a titanium layer are alternately laminated. Although the titanium nitride layer and the titanium layer are heterogeneous material layers having different physical properties, since both of these layers include titanium, a film may be formed by a continuous process, which will be described in more detail later.

As another example, the capping layer 120 may have a structure in which a tantalum layer and a titanium layer are alternately stacked. The overall electrical conductivity of the capping layer 120 may be less than the electrical conductivity of the main conductive layer 110.

The capping layer 120 may have a sufficient thickness to effectively protect the main conductive layer 110. More particularly, the thickness t2 of the entire capping layer 120 may be at least about 400 Å to protect the main conductive layer 110. When a contact hole is formed on a layer disposed on the conductive pattern 100 for electrical connection, an etching material for etching an insulation layer may also remove the capping layer 120, which may expose the surface of the main conductive layer 110 to the etching material or plasma. Furthermore, layers may be generally over-etched to completely expose the conductive pattern 100 through the contact hole. As such, the thickness t2 of the entire capping layer 120 may be at least about 800 Å to prevent the capping layer 120 from being completely removed from over-etching and stably protect the surface of the main conductive layer 110.

The thickness t2 of the capping layer 120 may be less than the thickness t1 of the main conductive layer 110. According to an exemplary embodiment, the thickness t2 of the capping layer 120 may be less than or equal to about half the thickness t1 of the main conductive layer 110.

The taper angle $\theta_1$ of the conductive pattern 100, which is the angle of inclination of the side surface (side wall) of the conductive pattern 100 relative to the top surface of the base member 200, may be about 70° or less, and preferably about 60° or less. As the taper angle $\theta_1$ of the conductive pattern 100 decreases, it is possible to prevent an insulating material from not being charged (or filled) in the vicinity of the side surface of the conductive pattern 100, and to prevent the quality of a film disposed on the conductive pattern 100 from being non-uniform. In order to form a more uniform film on the conductive pattern 100, the taper angle $\theta_2$ of the capping layer 120 relative to the top surface of the main conductive layer 110 on which it is disposed may be less than the taper angle $\theta_1$ of the main conductive layer 110. The taper angle $\theta_2$ of the capping layer 120 may be about 50° or less, or about 45° or less. For example, the taper angle $\theta_1$ of the main conductive layer 110 may be about 57.3°, while the taper angle $\theta_2$ of the capping layer 120 may be about 21.4°. As the side surface of the first conductive pattern 100 has taper angles $\theta_1$ and $\theta_2$, the average line width of the capping layer 120 disposed on the main conductive layer 110 may be less than the average line width of the main conductive layer 110.

Figure 2:
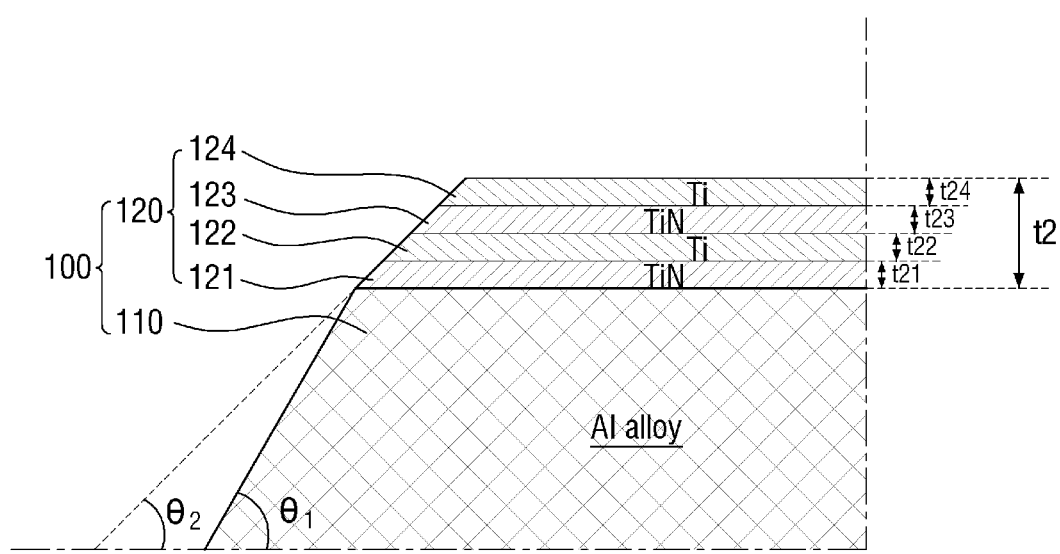
FIG. 2 is an enlarged view of area A of FIG. 1.

FIG. 2 is an enlarged view of area A in FIG. 1. According to an exemplary embodiment, the main conductive layer 110 illustrated in FIG. 2 includes an aluminum alloy and the capping layer 120 has a four-layer structure, in which titanium nitride layers and titanium layer are alternately laminated.

Referring to FIG. 2, the capping layer 120 may include a first capping component layer 121, a second capping component layer 122, a third capping component layer 123, and a fourth capping component layer 124, which are sequentially laminated. The first capping component layer 121 may be disposed directly on the main conductive layer 110. The bottom surface of the first capping component layer 121 is in contact with the top surface of the main conductive layer 110. The bottom surface of the first capping component layer 121 and the top surface of the main conductive layer 110 may be aligned without protruding from each other. For example, side surfaces of the first capping component layer 121 and the main conductive layer 110 may be formed substantially along an imaginary line.

When each of the capping component layers 121 to 124 includes one of titanium nitride and titanium, the first capping component layer 121 directly in contact with the main conductive layer 110 may include a titanium nitride layer.

More particularly, when the first capping component layer 121 is made of titanium, the aluminum component of the main conductive layer 110 may directly contact the titanium component of the first capping component layer 121, which may cause diffusion of the metal components at the interface therebetween during a subsequent annealing process. In this manner, an aluminum-titanium alloy may be formed at the interface, which may adversely increase the resistance of the conductive pattern 100.

In addition, titanium can be easily corroded by 0.9 wt % of hydrofluoric acid (HF) or the like used as a cleaning liquid in a cleaning process, such as buffer oxide etching (BOE), thereby inducing undercuts on the main conductive layer 110 and deteriorate the quality of the film. Further, when the surface of the main conductive layer 110 is exposed to the hydrofluoric acid (HF) by the corrosion of titanium, the aluminum component of the main conductive layer 110 may react with hydrofluoric acid and cause surface damage.

Accordingly, the first capping component layer 121 according to an exemplary embodiment is made of titanium nitride, thereby preventing or mitigating the diffusion of the metal components at the interface with the main conductive layer 110 as compared to when the first capping component layer 121 is made of titanium. Further, since titanium nitride does not easily react with fluoric acid or the like compared to titanium, the surface of the main conductive layer 110 may be protected during a cleaning process that uses BOE as a cleaning liquid.

The thickness t21 of the first capping component layer 121 may be at least about 150 Å. When the thickness t21 of the first capping component layer 121 is at least about 150 Å, diffusion of the aluminum component in the main conductive layer 110 may be effectively suppressed.

Meanwhile, when the thickness t21 of the first capping component layer 121 is too large, process efficiency may be deteriorated. For example, the first capping component layer 121 made of titanium nitride may be formed by reactive sputtering using titanium as a target and nitrogen as a sputtering gas. However, if the titanium nitride layer were formed excessively thick, reactive sputtering would be continued for a long time, which may form redeposited particles on the inner wall of the titanium target or the sputtering chamber. Further, when a plurality of conductive patterns 100 are formed through a sputtering apparatus, redeposited particles may be accumulated, which may function as a contamination source. Although a part of the contamination source from the redeposited particles may be removed through a dummy conductive pattern forming process, such process would be an additional process that lowers process efficiency. Therefore, it is not preferable to form a thick single titanium nitride layer. As such, the thickness t21 of the first capping component layer 121 may be about 400 Å or less. Accordingly, the thickness of the first capping component layer 121 may be in a range of about 150 Å to about 400 Å.

The atomic ratio (the number of nitrogen atoms/the number of titanium atoms) of nitrogen (N) and titanium (Ti) in the first capping component layer 121 may be about 0.9 to about 1.2. When the atomic ratio of nitrogen (N) to titanium (Ti) is greater than about 0.9, the formation of an aluminum-titanium alloy can be effectively prevented. In an exemplary embodiment, the first capping component layer 121 may be made of titanium nitride (N rich $TiN_x$) having a larger number of nitrogen atoms than titanium atoms (e.g., the atomic ratio of nitrogen to titanium is 1 or more). When the atomic ratio of nitrogen (N) to titanium (Ti) is about 1.2 or less, an excessive increase in resistance may be prevented and the formation of redeposited particles may be suppressed as described above.

The ratio of nitrogen atoms in the first capping component layer 121 may be substantially uniform regardless of their position in the first capping component layer 121, but the inventive concepts are not limited thereto. The degree of distribution of nitrogen atoms may be changed depending on the position in the thickness direction of the first capping component layer 121.

The second capping component layer 122 is disposed directly on the first capping component layer 121. The bottom surface of the second capping component layer 122 is in contact with the top surface of the first capping component layer 121 to form an interface. The bottom surface of the second capping component layer 122 and the top surface of the first capping component layer 121 may be aligned without protruding from each other. As described above, when the first capping component layer 121 is a titanium nitride layer, the second capping component layer 122 may be a titanium layer, which is a heterogeneous material layer. As used herein, the titanium layer may refer to a layer including titanium as a main component, which may include an insignificant amount of nitrogen. Even when an extremely small amount of nitrogen is included in the titanium layer, or nitrogen is partially added as impurities, such that the atomic ratio of nitrogen (N) to titanium (Ti) is about 0.02 or less, or about 0.01 or less, the effect of nitrogen on the physical properties of the corresponding layer may not be substantial.

The second capping component layer 122 may be formed by sputtering using titanium as a target. The sputtering gas used to form the second capping component layer 122 may be an inert gas, such as argon or helium.

The second capping component layer 122 may be formed by a continuous sputtering process subsequent to the formation of the first capping component layer 121. For example, in one sputtering apparatus including a titanium target, sputtering may be first performed while supplying nitrogen as a sputtering gas to form the first capping component layer 121 made of titanium nitride, and then, in the same sputtering apparatus, the sputtering gas may be changed to an inert gas and sputtering may continued to form the second capping component layer 122 made of titanium. As described above, since redeposited particles, which are partially formed while forming the first capping component layer 121, can be removed at least partially through a subsequent process of forming the second capping component layer 122, and thus, the accumulation of redeposited particles in the sputtering apparatus can be prevented.

The thickness t22 of the second capping component layer 122 may be in a range of about 50 Å to about 200 Å. When the thickness t22 of the second capping component layer 122 is less than about 50 Å, it may be difficult to control film uniformity, and the effect of removing redeposited particles may be insignificant. As such, the thickness t22 of the second capping component layer 122 may be at least about 100 Å to improve film uniformity and process efficiency.

As described above, the titanium layer of the second capping component layer 122 is vulnerable to hydrofluoric acid. Therefore, when the thickness t22 of the second capping component layer 122 is too large, undercuts may be caused, which may deteriorate the quality of the film formed. In addition, titanium can be more easily oxidized as titanium oxide than titanium nitride in the manufacturing process. Therefore, as the thickness of the titanium layer increases, the degree of oxidation of titanium and the content of titanium oxide may be increased, which may increase the resistance of the second capping component layer 122. As such, the thickness of the second capping component layer 122 may be adjusted within a range of about 200 Å or less.

The third capping component layer 123 is disposed directly on the second capping component layer 122. The bottom surface of the third capping component layer 123 is in contact with the top surface of the second capping component layer 122. The bottom surface of the third capping component layer 123 and the top surface of the second capping component layer 122 may be aligned without protruding from each other. The third capping component layer 123, similarly to the first capping component layer 121, includes titanium nitride. The third capping component layer 123 covers the second capping component layer 122 to prevent the second capping component layer 122 from being excessively etched by hydrofluoric acid or the like.

The third capping component layer 123 may be formed by a continuous sputtering process. That is, after the formation of the second capping component layer 122 in the sputtering apparatus, the sputtering gas may be changed from an inert gas to a nitrogen gas, and reactive sputtering may be performed to form the third capping component layer 123.

Since the third capping component layer 123 is not in direct contact with the main conductive layer 110, unlike the first capping component layer 121, the third capping component layer 123 may have a thickness less than or equal to the thickness of the first capping component layer 121. The thickness t23 of the third capping component layer 123, similarly to thickness of the second capping component layer 122, may be adjusted to be in a range of about 50 Å to about 200 Å, or about 100 Å to about 200 Å. When the thickness t23 of the third capping component layer 123 is at least about 50 Å or about 100 Å, the film uniformity may be improved. When the thickness t23 of the third capping component layer 123 is set to about 200 Å or less, the accumulation of redeposited particles in the sputtering apparatus can be effectively prevented.

The atomic ratio of nitrogen to titanium in the third capping component layer 123 may be substantially the same as that in the first capping component layer 121. However, unlike the first capping component layer 121, the content of nitrogen in the third capping component layer 123 may be lower than that in the first capping component layer 121 as diffusion of the aluminum component is less likely to occur in the third capping component layer 123.

The fourth capping component layer 124 is disposed directly on the third capping component layer 123. The bottom surface of the fourth capping component layer 124 is in contact with the top surface of the third capping component layer 123. The bottom surface of the fourth capping component layer 124 and the top surface of the third capping component layer 123 may be aligned without protruding from each other. The fourth capping component layer 124, similarly to the second capping component layer 122, includes titanium, and the thickness thereof may be in a range of about 50 Å to about 200 Å, or about 100 Å to about 200 Å.

The fourth capping component layer 124 may be formed by a continuous sputtering process. That is, after the formation of the third capping component layer 123 in the sputtering apparatus, the sputtering gas may be changed from a nitrogen gas to an inert gas, and reactive sputtering may be performed to form the fourth capping component layer 124.

In some exemplary embodiments, the thicknesses t21 to t24 of all of the capping component layers 121-124 may be substantially the same. For example, the total thickness t2 of the capping layer 120 may be about 800 Å, and the first capping component layer 121, the second capping component layer 122, the third capping component layer 123, and the fourth capping component layer 124 may all have substantially the same thickness of about 200 Å. In another exemplary embodiment, the thickness t21 of the first capping component layer 121 may be greater than each of the thicknesses t22 to t24 of the other capping component layers 122 to 124. The thicknesses t22 to t24 of the remaining capping component layers 122 to 124 other than the first capping component layer 121 may be substantially the same, but the inventive concepts are not limited thereto.

The taper angles $\theta_2$ of all of the capping component layers 121 to 124 may be substantially the same. Among the capping component layers, the first capping component layer 121 may have the widest average line width, and the second capping component layer 122, the third capping component layer 123, and the fourth capping component layer 124 may have successively reduced average line widths. According to an exemplary embodiment, side surfaces of the capping component layers 121 to 124 may all be on substantially the same plane.

The conductive pattern 100 constructed according to the principles of the invention may effectively prevent the damage of the main conductive layer 110 from a cleaning process or an etching process while forming the main conductive layer 110 with a low-resistance material, such as aluminum or an aluminum alloy. Since the taper angle $\theta_2$ of the capping layer 120 is relatively small, it is possible to prevent the insulating material from not being charged (or filled) in the vicinity of the side surface of the conductive pattern 100, or prevent a film disposed on the conductive pattern 100 from being non-uniform.

According to an exemplary embodiment, tantalum may be alternately laminated with titanium, instead of titanium nitride. In this case, similarly to titanium nitride, diffusion of aluminum into tantalum may be suppressed compared to diffusion of aluminum into titanium, and tantalum does not easily react with hydrofluoric acid compared to titanium. Therefore, with reference to FIG. 2, tantalum may be disposed in layers indicated with titanium nitride (TiN). That is, in FIG. 2, the first capping component layer 121 and the third capping component layer 123 may be made of tantalum, and the second capping component layer 122 and the fourth capping component layer 124 may be made of titanium.

Hereinafter, a conductive pattern according to another exemplary embodiments will be described.

Figure 3:
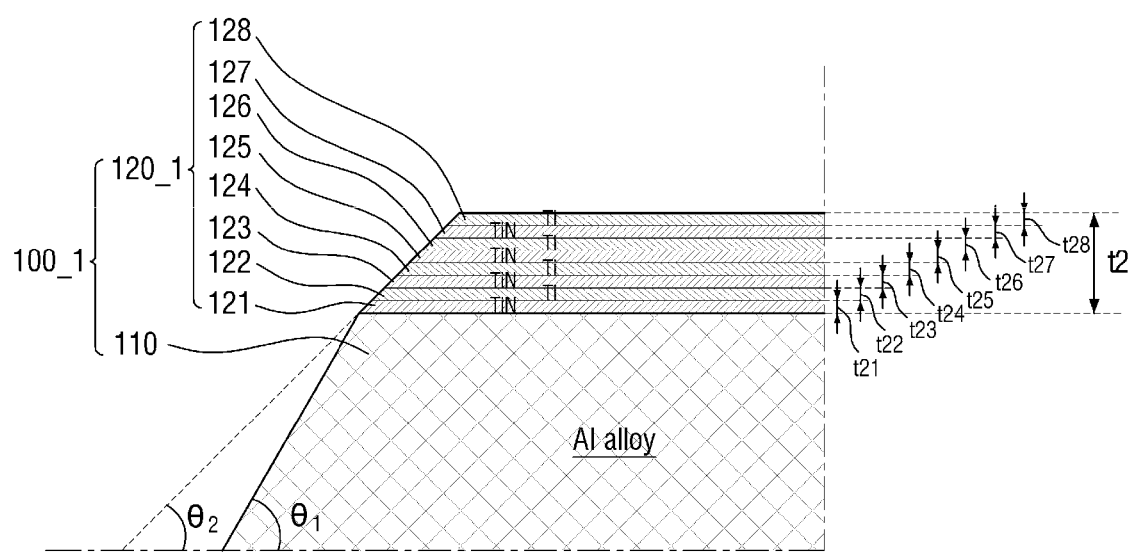
FIGS. 3, 4, 5, 6, 7, 8, 9, and 10 are partial cross-sectional views of conductive patterns constructed according to exemplary embodiments of the invention.

FIG. 3 is a cross-sectional view of a conductive pattern according to another exemplary embodiment.

Referring to FIG. 3, a capping layer 120_1 of a conductive pattern 100_1 includes eight capping component layers. More particularly, the capping layer 120_1 includes a first capping component layer 121, a second capping component layer 122, a third capping component layer 123, a fourth capping component layer 124, a fifth capping component layer 125, a sixth capping component layer 126, a seventh capping component layer 127, and an eighth capping component layer 128, which are sequentially laminated. The first capping component layer 121, the third capping component layer 123, the fifth capping component layer 125, and the seventh capping component layer 127 may be made of titanium nitride, and the second capping component layer 122, the fourth capping component layer 124, the sixth capping component layer 126, and the eighth capping component layer 128 may be made of titanium. The first to eighth capping component layer 121 to 128 may be sequentially formed by a continuous sputtering process.

In an exemplary embodiment, the thickness t2 of the entire capping layer 120_1 may be about 800 Å, and the thicknesses t21 to t28 of the first to eighth capping component layers may have substantially the same thickness of about 100 Å. When the first capping component layer 121 has a thickness of about 100 Å, some of an aluminum component from the main conductive layer 110 may be diffused into the first capping component layer 121. However, since the third capping component layer 123 is also made of titanium nitride, further diffusion of aluminum may be suppressed. When each of the thicknesses t21 to t28 of the capping component layers 121 to 128 is about 100 Å, uniform film quality can be obtained, undercuts and oxidation of the titanium layer can be prevented, and contamination from redeposited particles can be reduced.

According to an exemplary embodiment, in order to sufficiently prevent the diffusion of an aluminum component, the thickness t21 of the first capping component layer 121 may be in a range of about 150 Å to about 400 Å, and each of the thicknesses t22 to t28 of the remaining second to eighth capping component layers 122 to 128 may be about 100 Å.

Figure 4:
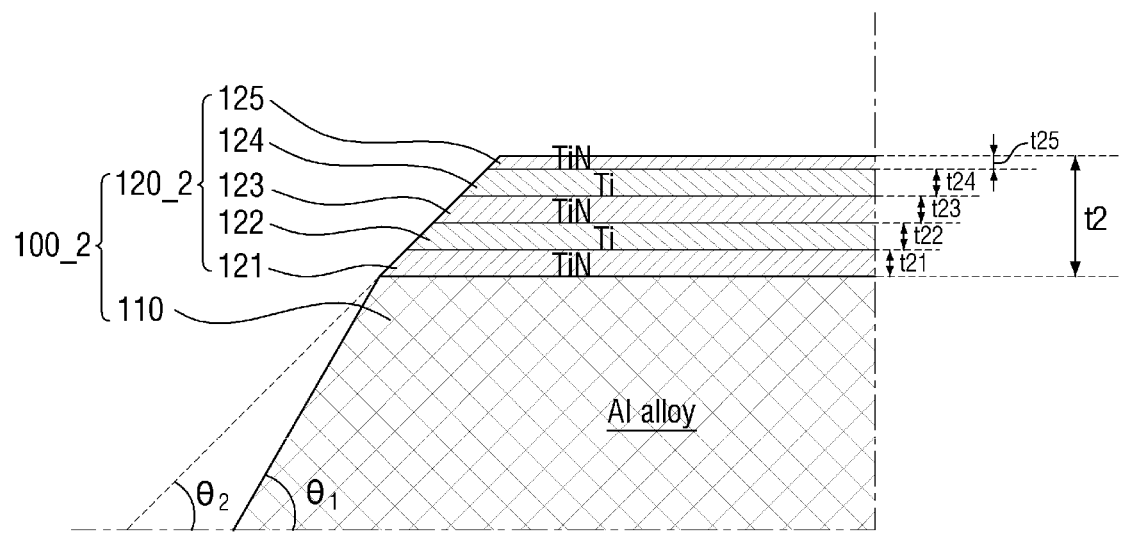

FIG. 4 is a cross-sectional view of a conductive pattern according to still another exemplary embodiment.

Referring to FIG. 4, a conductive pattern 100_2 is different from the conductive pattern 100 of FIG. 2 in that a fifth capping component layer 125 is further disposed on the fourth capping component layer 124.

The fifth capping component layer 125 is disposed directly on the fourth capping component layer 124. The bottom surface of the fifth capping component layer 125 is in contact with the top surface of the fourth capping component layer 124. The bottom surface of the fifth capping component layer 125 and the top surface of the fourth capping component layer 124 may be aligned without protruding from each other.

The fifth capping component layer 125, similarly to the third capping component layer 123, includes titanium nitride. The fifth capping component layer 125 forming the uppermost layer of the capping layer 120_2 may be made of titanium nitride, so that the oxidation of the surface of the capping layer 120_2 can be prevented. Since the fourth capping component layer 124 made of titanium is covered and protected by the fifth capping component layer 125, the oxidation of titanium in the fourth capping component layer 124 can also be prevented. In addition, since the fifth capping component layer 125 made of titanium nitride is more resistant to hydrofluoric acid or an insulating film etching material compared to the fourth capping component layer 124, the fifth capping component layer 125 may prevent damage to the layers thereunder.

In this case, since the primary role of the fifth capping component layer 125 is to prevent surface oxidation, the fifth capping component layer 125 may have a thickness different from those of other capping component layer 121 to 124. In particular, the fifth capping component layer 125 may have a thickness sufficient to coat the fourth capping component layer 124. As such, the fifth capping component layer 125 may have a thickness t25 less than that of each of the first to fourth capping component layers 121 to 124, although not limited thereto. For example, each of the first to fourth capping component layers 121 to 124 may have a thickness of about 200 Å, whereas the fifth capping component layer 125 may be formed to have a thickness of about 50 Å.

Figure 5:
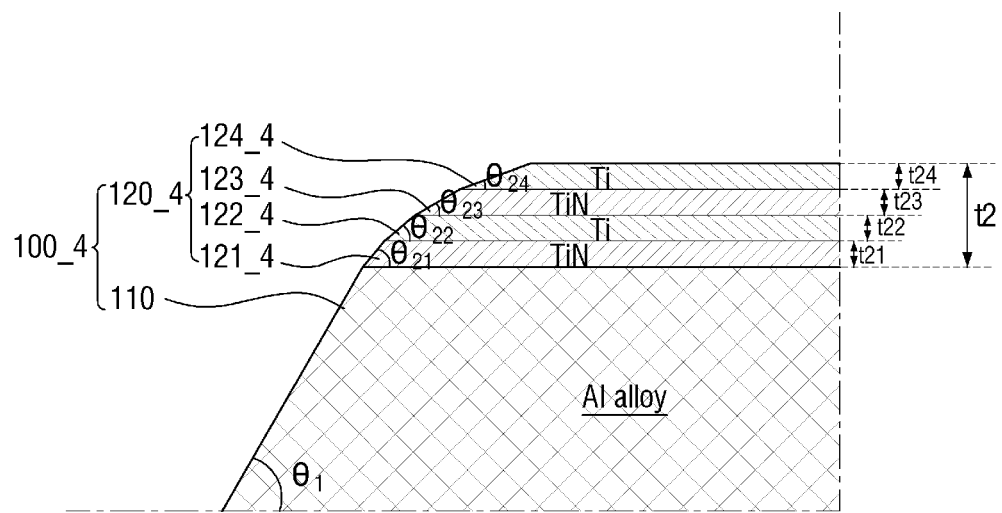

FIG. 5 is a cross-sectional view of a conductive pattern according to still another exemplary embodiment.

Referring to FIG. 5, a conductive pattern 100_4 is different from the conductive pattern 100 of FIG. 2 in that a capping layer 120_4 includes capping component layers having different taper angles θ from each other.

In particular, the taper angles $\theta_{21}$ to $\theta_{24}$ of the conductive pattern 100_4 may be formed successively smaller toward the upper layer. That is, the taper angle $\theta_{21}$ of a first capping component layer 121_4 may be smaller than the taper angle $\theta_1$ of the main conductive layer 110, the taper angle $\theta_{22}$ of a second capping component layer 122_4 may be smaller than the taper angle $\theta_{21}$ of the first capping component layer 121_4, the taper angle $\theta_{23}$ of a third capping component layer 123_4 may be smaller than the taper angle $\theta_{22}$ of the second capping component layer 122_4, and the taper angle $\theta_{24}$ of a fourth capping component layer 124_4 may be smaller than the taper angle $\theta_{23}$ of the third capping component layer 123_4. In this manner, when the taper angles $\theta_{21}$ to $\theta_{24}$ of the capping component layers 121_4, 122_4, 123_4, and 124_4 gradually decrease toward the upper layer, an insulating material may even more be filled in the side surface of the conductive pattern 100_4, when an insulating film or the like is formed on the conductive pattern 100_4, which may improve the film quality of the insulating film or the like can be further improved.

Figure 6:
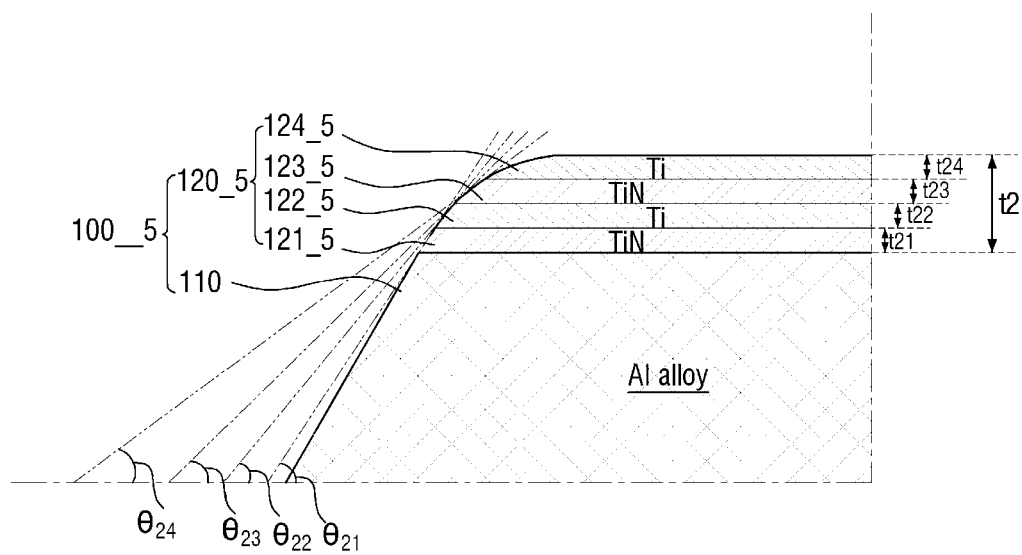

FIG. 6 is a cross-sectional view of a conductive pattern according to still another exemplary embodiment.

Referring to FIG. 6, a conductive pattern 100_5 is different from the conductive pattern 100_4 of FIG. 5 in that the side surfaces of the capping component layers 121_5, 122_5, 123_5, and 124_5 of the capping layer 120_5 are curved, whereas the side surfaces of the capping component layers 121_4, 122_4, 123_4, and 124_4 of the capping layer 120-4 are flat.

The taper angle of a capping component layer having a curved side surface may be expressed by an inclination angle of a tangential plane (e.g., tangential line on cross-sectional view) at the side surface. When the inclination angle of the tangential plane at the bottom point of the side surface is defined as the taper angle of the capping component layer, the taper angle $\theta_{21}$ of the first capping component layer 121_5 may be smaller than the taper angle $\theta_1$ of the main conductive layer 110, the taper angle $\theta_{22}$ of the second capping component layer 122_5 may be smaller than the taper angle $\theta_{21}$ of the first capping component layer 121_5, the taper angle $\theta_{23}$ of the third capping component layer 123_5 may be smaller than the taper angle $\theta_{22}$ of the second capping component layer 122_5, and the taper angle $\theta_{24}$ of the fourth capping component layer 124_5 may be smaller than the taper angle $\theta_{23}$ of the third capping component layer 123_5. In this manner, when the taper angles $\theta_{21}$ to $\theta_{24}$ of the capping component layers 121_5, 122_5, 123_5, and 124_5 gradually decreases toward the upper layer, an insulating material may even more be filled in the side surface of the conductive pattern 100_5 when an insulating film or the like is formed on the conductive pattern 100_5, which may improve the film quality of the insulating film or the like.

Figure 7:
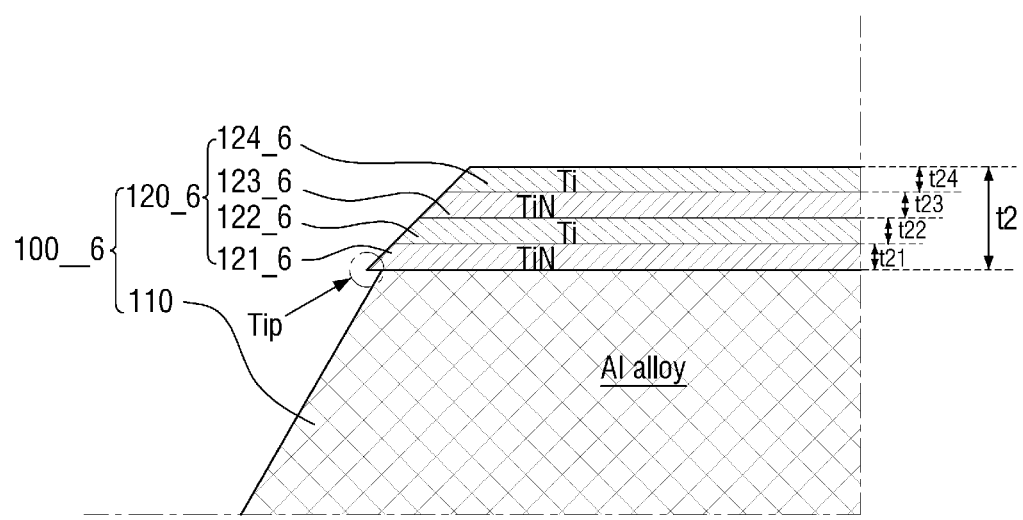
Figure 8:
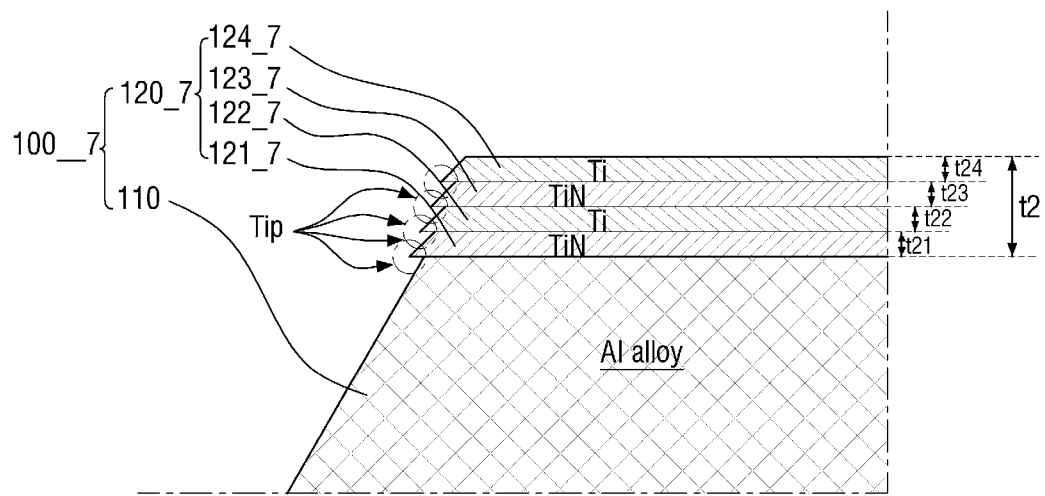
Figure 9:
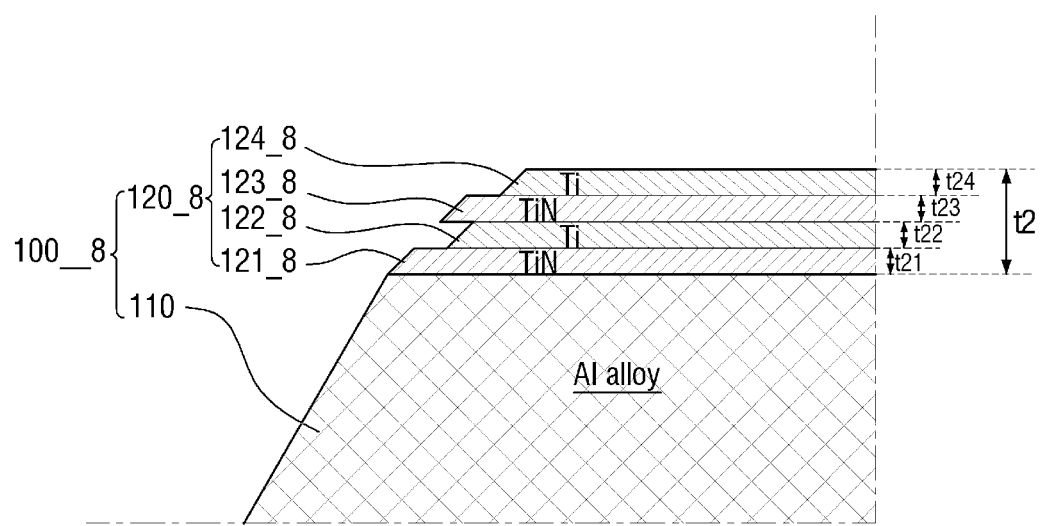

FIGS. 7 to 9 are cross-sectional views of conductive patterns according to other exemplary embodiments. FIGS.

7 to 9 illustrate that a conductive pattern is not completely aligned (not substantially flush) at interfaces between the layers, and may at least partially protrude depending on manufacturing process conditions.

In particular, referring to FIG. 7, side surfaces of first to fourth capping component layers 121_6, 122_6, 123_6, and 124_6 forming a capping layer 120_6 of a conductive pattern 100_6 are all formed on the same plane, and are aligned at each interface without protruding from each other. However, a tip protruding outwardly from the top surface of the main conductive layer 110 is formed between the main conductive layer 110 and the first capping component layer 121_6.

Referring to FIG. 8, in addition to a first capping component layer 121_7 of a capping layer 120_7 of a conductive pattern 100_7, each of a second capping component layer 122_7, a third capping component layer 123_7, and a fourth capping component layer 124_7 also includes a tip protruding outward from the top surface of a layer thereunder.

Referring to FIG. 9, the side surface of a second capping component layer 122_8 of a capping layer 120_8 of a conductive pattern 100_8 includes an undercut, such that the side surface of the second capping component layer 122_8 is disposed inwardly with respect to the side surface of a third capping component layer 123_8 disposed thereon. The side surface of the second capping component layer 122_8 is also disposed inwardly with respect to the side surface of a first capping component layer 121_8 disposed beneath the second capping component layer 122_8. Further, the side surface of a fourth capping component layer 124_8 is disposed inwardly with respect to the side surface of the third capping component 123_8 disposed beneath the fourth capping component layer 124_8.

The shapes illustrated in FIGS. 7 to 9 may occur during an etching process for forming a conductive pattern or a subsequent process, when layers including different materials are etched by an etching material or a cleaning solution, or corroded at different rates. Although such tips and undercuts may adversely affect the quality of a film formed thereon, the tips and undercuts may function as keeping the overall taper angle small, and form the taper angle of the capping layer to be smaller than the taper angle of the main conductive layer, thereby minimizing defects during film formation.

Figure 10:
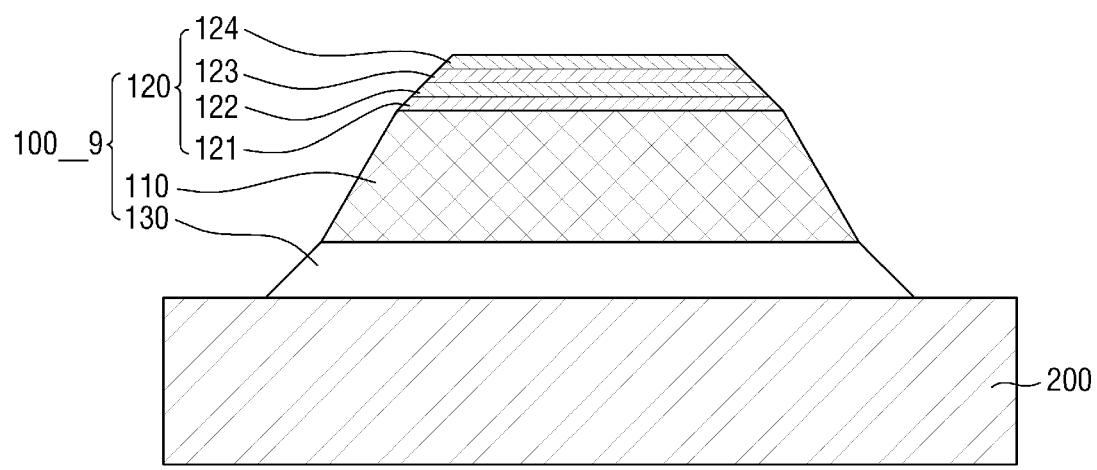

FIG. 10 is a cross-sectional view of a conductive pattern according to still another exemplary embodiment.

Referring to FIG. 10, a conductive pattern 100_9 is different from the conductive pattern 100 of FIG. 2 in that the conductive pattern 100_9 further includes a barrier layer 130 in addition to the main conductive layer 110 and the capping layer 120.

The barrier layer 130 is disposed on the bottom surface of the main conductive layer 110. As such, the conductive pattern 100_9 includes the barrier layer 130, the main conductive layer 110, and the capping layer 120 laminated on each other. The barrier layer 130 may prevent the components of the main conductive layer 110 from being diffused into the base member 200, or prevent an organic material, an inorganic material, moisture, oxygen or the like from permeating into the main conductive layer 110 through the base member 200.

The barrier layer 130 may include titanium, titanium nitride, tantalum, or the like. The barrier layer 130 may have a structure in which heterogeneous materials are alternately laminated. For example, the barrier layer 130 may have a first barrier component layer including titanium nitride contacting the bottom surface of the main conductive layer 110, a second barrier component layer including titanium disposed beneath the first barrier component layer.

The taper angle of the barrier layer 130 may be smaller than the taper angle of the main conductive layer 110, and substantially equal to the taper angle of the capping layer 120. However, the inventive concepts are not limited thereto.

Hereinafter, a method of manufacturing a conductive pattern according to the principles of the invention will be described.

FIGS. 11 to 15 are cross-sectional views illustrating the steps of manufacturing a conductive pattern according to an exemplary embodiment.

Figure 11:
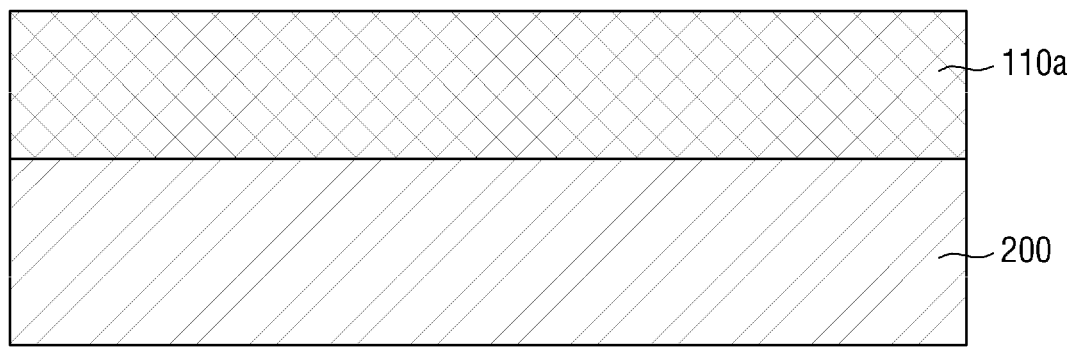
FIGS. 11, 12, 13, 14, and 15 are cross-sectional views illustrating the steps of manufacturing a conductive pattern according to an exemplary embodiment of the invention.

Referring to FIG. 11, a main conductive material layer 110a including aluminum or an aluminum alloy is formed on a base member 200. The main conductive material layer 110a may be formed by performing a sputtering process in a first sputtering apparatus including an aluminum target.

Figure 12:
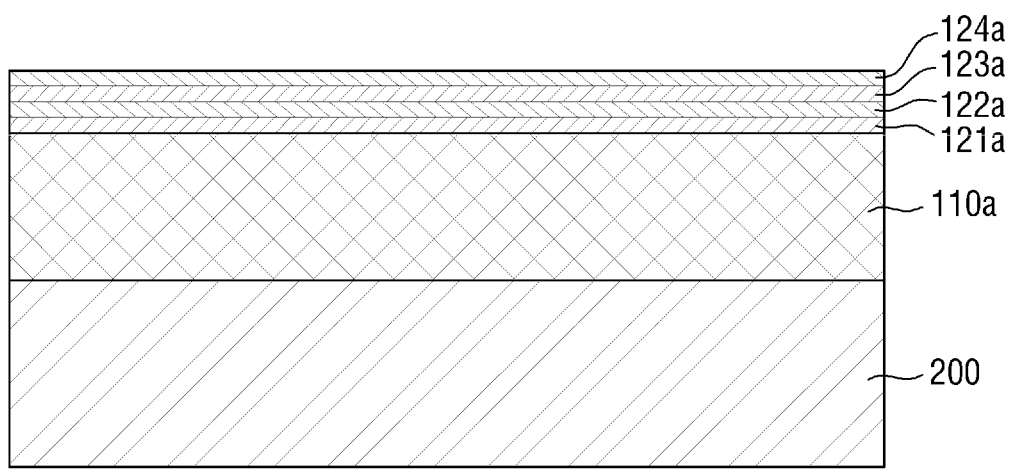

Referring to FIG. 12, a capping material layer including first to fourth capping component material layers 121a to 124a is formed on the main conductive material layer 110a. The first to fourth capping component material layers 121a to 124a may be formed by a continuous sputtering process.

More particularly, the base member 200 provided with the main conductive material layer 110a is placed in a second sputtering apparatus including a titanium target. Then, reactive sputtering is performed using nitrogen gas as sputtering gas to form a first capping component material layer 121a including titanium nitride.

Subsequently, in the second sputtering apparatus, sputtering gas is replaced by argon gas from nitrogen gas, and sputtering continuously proceeds to form the second capping component material layer 122a including titanium.

Subsequently, in the second sputtering apparatus, argon gas is again replaced by nitrogen gas as sputtering gas, and reactive sputtering continuously proceeds to form a third capping component material layer 123a including titanium nitride.

Subsequently, in the second sputtering apparatus, nitrogen gas is again replaced by argon gas as sputtering gas, and sputtering continuously proceeds to form a fourth capping component material layer 124a including titanium.

Figure 13:
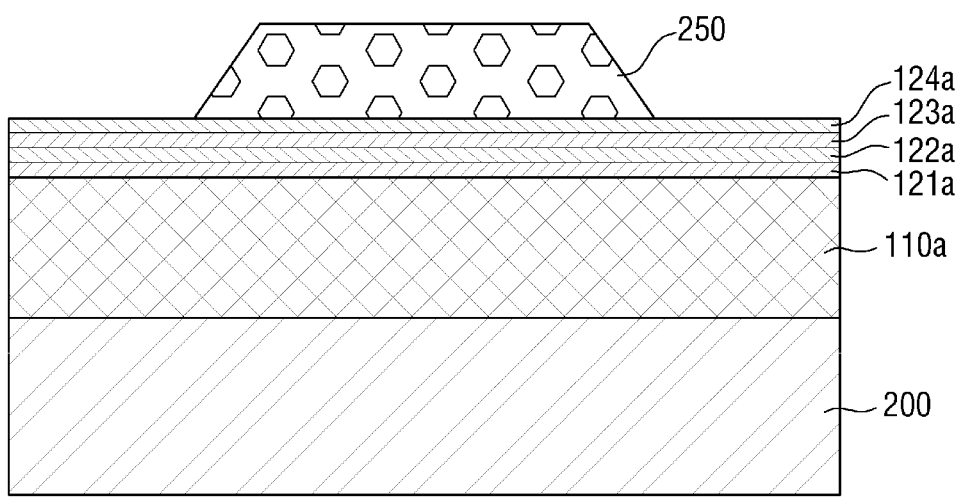

Referring to FIG. 13, a photoresist pattern 250 is formed on the fourth capping component material layer 124a. Subsequently, an etching process of etching the capping component material layers 121a to 124a and the main conductive material layer 110a is performed using the photoresist pattern 250 as an etching mask. The etching process may be performed by dry etching. The etching process can be divided into a primary etching process and a secondary etching process which have different in etching conditions.

Figure 14:
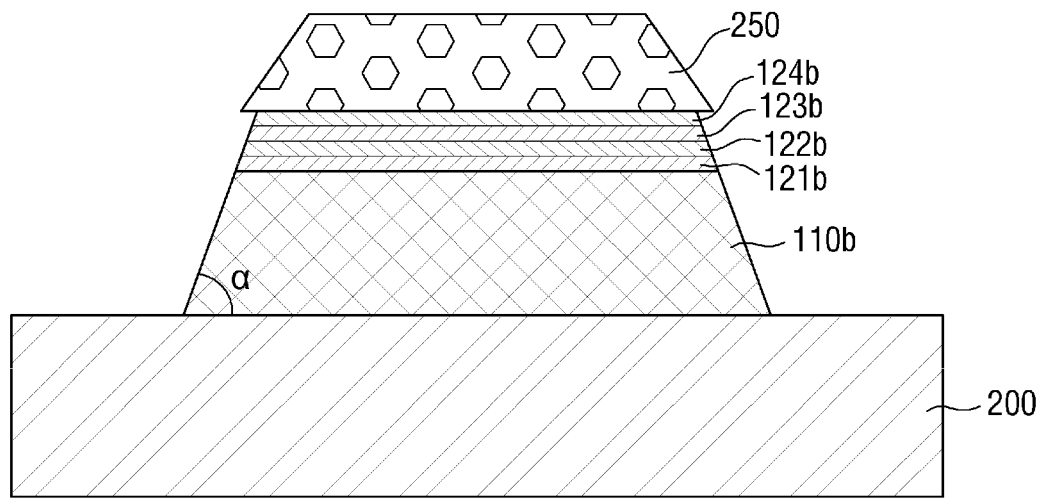
Figure 15:
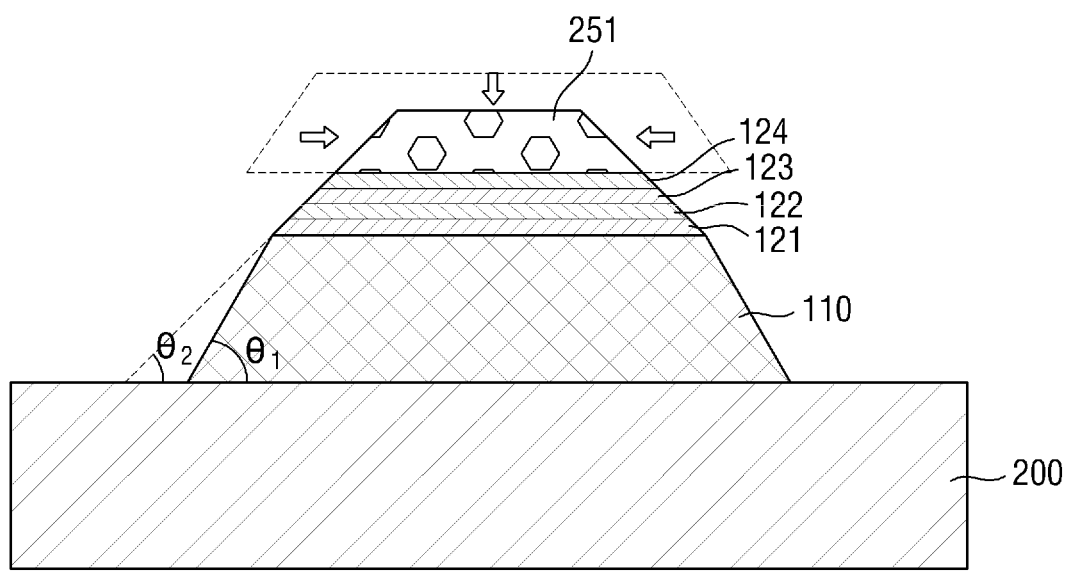

FIG. 14 shows a primary etching process, and FIG. 15 shows a secondary etching process according to exemplary embodiments.

Referring to FIGS. 13 and 14, the primary etching process is performed under a first etching condition. The first etching condition may have a higher etching rate for the capping component material layers 121a to 124a and the main conductive material layer 110a than that used in the secondary etching process, and may have lower consumption rate for the photoresist pattern 250 than that used in the secondary etching process. During the primary etching process, the photoresist pattern 250 substantially keeps the original shape, whereas the fourth capping component material layer 124a, the third capping component material layer 123a, the second capping component material layer 122a, the first capping component material layer 121a, and the main conductive material layer 110a are etched by using the photoresist pattern 250 as an etching mask. The taper angle α of the etched capping material layers 121b to 124b and the main conductive material layer 110b may be relatively large. For example, the taper angle α may be greater than about 70°, but the inventive concepts are not limited thereto. When the primary etching is completed, the taper angle α of the capping component material layers 121b to 124b and the main conductive material layer 110b may be substantially the same.

Referring to FIGS. 14 and 15, the secondary etching process is performed after the primary etching process. The secondary etching process is performed under a second etching condition, in which the etching rate for the capping component material layer 121a to 124a and the main conductive material layer 110a is relatively lower than that in the primary etching process, and the consumption rate for the photoresist pattern 250 is higher than that in the primary etching process. During the secondary etching, the photoresist pattern 251 decreases in size according to the second etching condition. As such, the capping component material layers 121b to 124b covering the periphery of the photoresist pattern 251 are sequentially exposed. The exposed capping component material layers 121b to 124b and the main conductive material layer 110b may be further etched by an etching material to reduce the taper angle. The taper angles $\theta_1$ and $\theta_2$ of the capping layer 120 and the main conductive layer 110 formed through this step may be about 70° or less, and further, about 60° or less.

Meanwhile, the capping component material layers 121b to 124b are actively etched as the surfaces thereof are exposed to an etching material since the photoresist pattern 251 becomes smaller, whereas the main conductive material layer 110b disposed under the capping component material layers 121b to 124b is relatively slowly etched because the capping component material layers 121b to 124b can function as a hard mask. Therefore, the taper angle of the capping component material layers 121b to 124b may become smaller than the taper angle of the main conductive material layer 110b disposed thereunder. In this manner, the taper angle $\theta_2$ of the capping component material layers 121b to 124b may become smaller than the taper angle $\theta_1$ of the main conductive material layer 110b. Subsequently, the remaining photoresist pattern 251 may be removed by an ashing or stripping process, thereby forming the conductive pattern 100 shown in FIG. 2.

Although FIG. 15 illustrates that the taper angles $\theta_2$ of the first to fourth capping component layers 121 to 124 are substantially the same as each other as those shown in FIG. 2, the first to fourth capping component layers 121 to 124 may be formed to have decreasing taper angles $\theta_2$ as shown in FIG. 5 or FIG. 6, according to the different etching conditions.

The above-described primary etching process and secondary etching process may be performed using an etching composition including the same material but having different material contents.

For example, the etching composition may include chlorine ($Cl_2$), boron chloride ($BCl_3$), and nitrogen ($N_2$). In order to satisfy the first etching condition and the second etching condition as described above, the etching composition (or etchant) having a higher chlorine content than the boron chloride content may be used in the primary etching process. In the secondary etching process, the etching composition (or etchant) may have lower chlorine content and higher boron chloride content that those of the primary etching process. Moreover, in the secondary etching process, the content of boron chloride may be higher than the content of chlorine. In the secondary etching process, the content of nitrogen increases compared to that in the primary etching process.

Hereinafter, an organic light emitting display device will be described as an exemplary application including a conductive pattern according to an exemplary embodiment.

Figure 16:
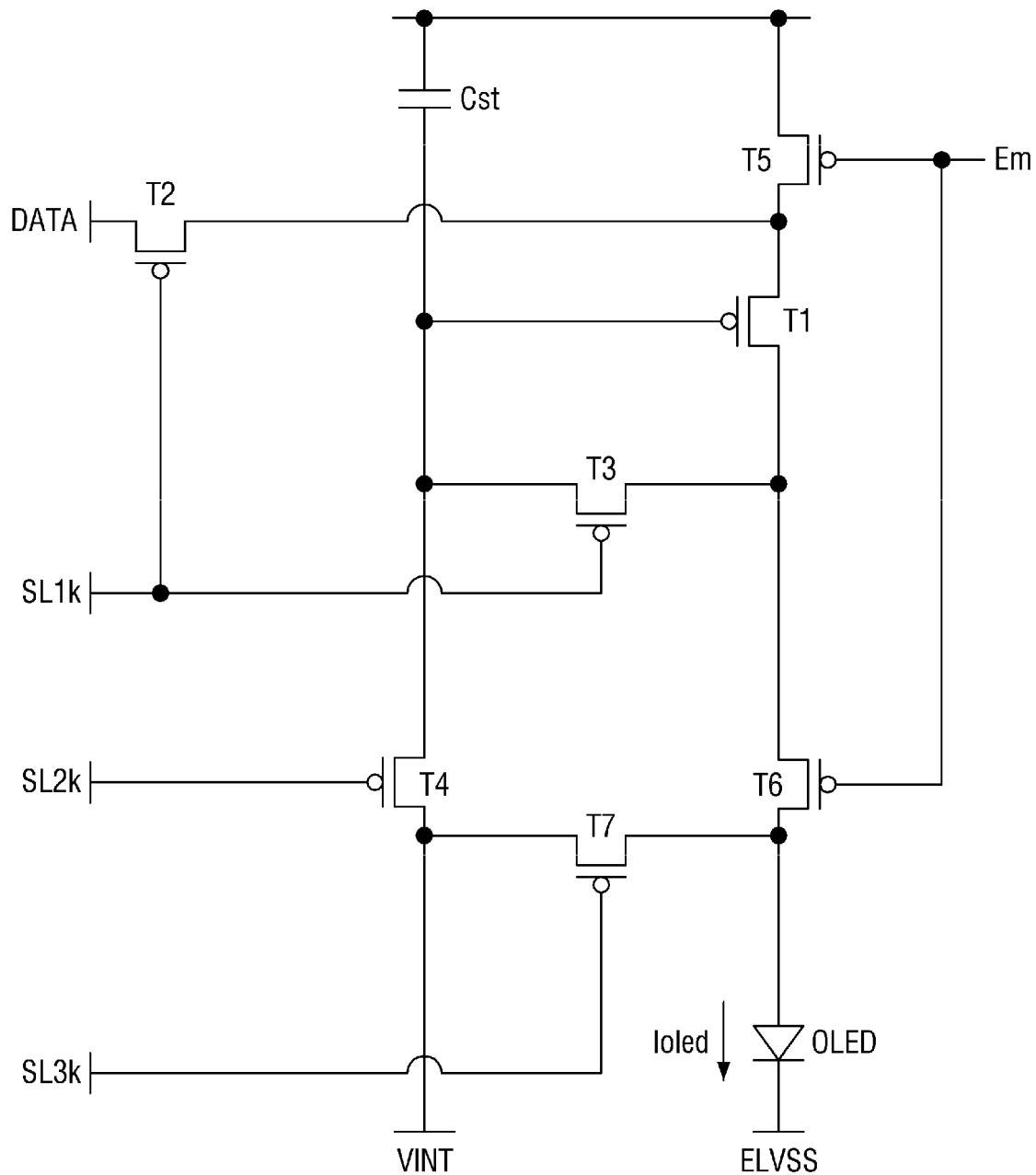
FIG. 16 is an equivalent circuit diagram of one pixel of an organic light emitting display device according to an exemplary embodiment of the invention.

FIG. 16 is an equivalent circuit diagram of one pixel of an organic light emitting display according to an exemplary embodiment. Referring to FIG. 16, the circuit of one pixel of an organic light emitting display according to an exemplary embodiment may include an organic light emitting diode OLED, a plurality of transistors T1 to T7, and a storage capacitor Cst. In the circuit of one pixel, a first scan signal SL1j, a second scan signal SL2j, a third scan signal SL3j, a light emission control signal EM, a first power supply voltage ELVDD, a second power supply voltage ELVSS, and an initialization voltage VINT are applied.

The organic light emitting diode OLED includes an anode electrode and a cathode electrode. The storage capacitor Cst includes a first electrode and a second electrode.

The plurality of transistors may include first to seventh transistors T1 to T7. Each of the transistors T1 to T7 includes a gate electrode, a source electrode, and a drain electrode.

Each of the transistors T1 to T7 may be a thin film transistor. Each of the transistors T1 to T7 may be any one of a PMOS transistor and an NMOS transistor. Although FIG. 16 shows all of the transistors T1 to T7 of the pixel as PMOS transistors, they may be NMOS transistors or a combination of PMOS transistors and NMOS transistors. For example, the first transistor T1 as a driving transistor, the second transistor T2 as a data transmission transistor, the fifth transistor T5 as a first light emission control transistor, and the sixth transistor T6 as a second light emission control transistor may be PMOS transistors. On the other hand, the third transistor T3 as a compensating transistor, the fourth transistor T4 as a first initializing transistor, and the seventh transistor T7 as a second initializing transistor may be NMOS transistors.

Although FIG. 16 illustrates 7 transistors and 1 capacitor (7T1C) structure as the pixel circuit of an organic light emitting display device, other various structures such as 2T1C, 5T1C, and 6T1C may be applied.

In the circuit structure of FIG. 16, the gate electrode of each of the transistors T1 to T7, at least some of scan signal lines, and the first electrode of the storage capacitor Cst may be formed as a first gate conductive layer disposed on the same layer. Further, the second electrode of the storage capacitor Cst may be formed as a second gate conductive layer disposed on a layer different from the first gate conductive layer. At least one of the first gate conductive layer and the second gate conductive layer may be formed as the conductive pattern according to the exemplary embodiments.

Further, the source electrode and drain electrode of each of the transistors T1 to T7, and/or the first power supply voltage ELVDD, may be formed as at least one of a first source/drain conductive layer and a second source/drain conductive layer, which may also be formed as the conductive pattern according to the exemplary embodiments.

Details thereof will be described with reference to FIG. 17.

Figure 17:
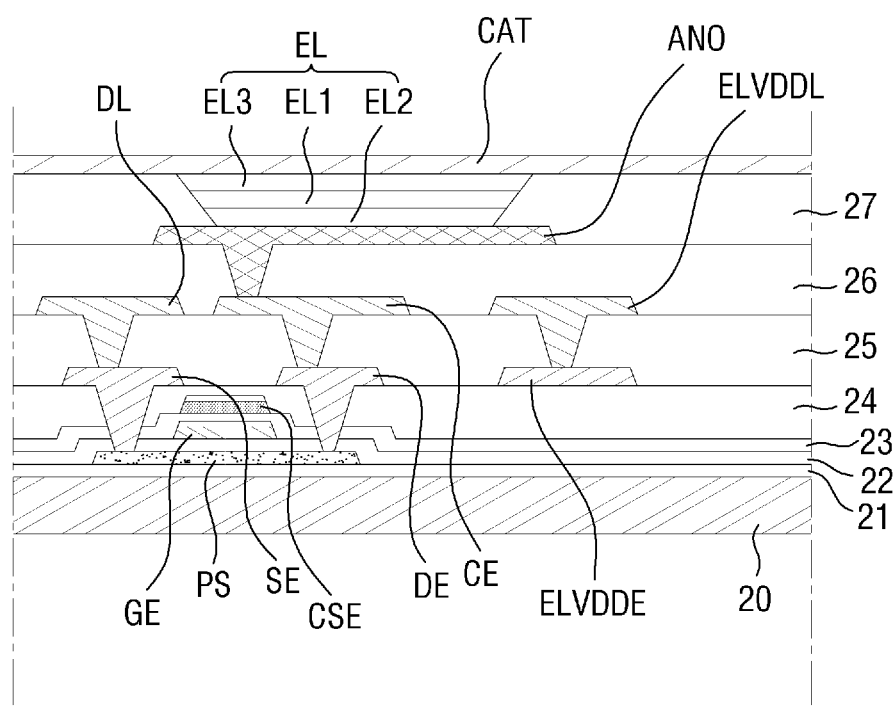
FIG. 17 is a cross-sectional view of one pixel of an organic light emitting display device according to an exemplary embodiment of the invention.

FIG. 17 is a cross-sectional view of one pixel of an organic light emitting display device according to an exemplary embodiment.

Referring to FIG. 17, an organic light emitting diode display device 10 may include a substrate 20, a buffer layer 21, a semiconductor layer PS, a first insulating layer 22, a first gate conductive layer, a second insulating layer 23, a second gate conductive layer, a third insulating layer 24, a first source/drain conductive layer, a fourth insulating layer 25, a second source/drain conductive layer, a fifth insulating layer 26, an anode electrode ANO, a pixel defining layer 27, an organic layer EL disposed in the opening of the pixel defining layer 27, and a cathode electrode CAT disposed on the organic layer EL and the pixel defining layer 27. Each of the above-described layers may be formed as a single film, but may also be formed as a laminated film including a plurality of films. Other layers may be further disposed between the respective layers.

The substrate 20 supports the respective layers disposed thereon. The substrate 20 may be made of an insulating material. The substrate 20 may be made of an inorganic material, such as glass or quartz, or may be made of an organic material, such as polyimide. The substrate 20 may be a rigid substrate or a flexible substrate.

The buffer layer 21 is disposed on the substrate 20. The buffer layer 21 can prevent diffusion of impurity ions and penetration of moisture or external air, and planarize top surface thereof. The buffer layer 21 may include silicon nitride, silicon oxide, silicon oxynitride, or the like. When an organic light emitting display device includes a bending portion, a portion of the buffer layer 21 corresponding to the bending portion (e.g., bending opening (BOP)) may be removed by a cleaning process using hydrofluoric acid. During the cleaning process using the hydrofluoric acid, a conductive layer may be damaged. As such, when the conductive layer is formed as the conductive pattern according to the exemplary embodiments, the capping layer can protect the main conductive layer from hydrofluoric acid, thereby preventing deterioration of electrical characteristics. The buffer layer 21 may be omitted depending on the type of the substrate 20, process conditions, and the like.

The semiconductor layer PS is disposed on the buffer layer 21. The semiconductor layer PS forms a channel of the thin film transistor. The semiconductor layer PS may include polycrystalline silicon. The regions (source/drain regions) connected to the source/drain electrodes of the thin film transistor in the semiconductor layer PS may be doped with impurity ions (p-type impurity ions in the case of a PMOS transistor). In another exemplary embodiment, the semiconductor layer PS may include monocrystalline silicon, low-temperature polycrystalline silicon, amorphous silicon, or an oxide semiconductor such as indium tin zinc oxide (ITZO) or indium gallium zinc oxide (IGZO).

The first insulating layer 22 may be a gate insulating film having a gate insulating function.

The first gate conductive layer is disposed on the first insulating layer 22. The first gate conductive layer includes a gate electrode GE of the thin film transistor. In addition, the first gate conductive layer may include a first electrode of the storage capacitor and a scan signal line transmitting a scan signal to the gate electrode GE.

The first gate conductive layer may have the structure of the conductive pattern according to the exemplary embodiments. In particular, the first gate conductive layer may include a main conductive layer including aluminum or an aluminum alloy, and a capping layer for protecting the main conductive layer.

The organic light emitting diode display device 10 may have a high resolution of 500 ppi or more. As the resolution increases, the gate-on time of the thin film transistor may be generally decreased. When the resistance of the scan signal line is high, the scan signal may be delayed. In this case, sufficient gate-on time cannot be ensured, and thus, horizontal stripes or display unevenness may be generated. Since the conductive pattern including aluminum or an aluminum alloy according to an exemplary embodiment has a low surface resistance of about 0.15Ω/□ (based on a thickness of 3 kÅ), delay of scan signal can be mitigated to reduce such defects, as compared to when a material having a relatively high surface resistance, for example, molybdenum is used.

The second insulating layer 23 is disposed on the first gate conductive layer. When the first gate conductive layer is formed of the conductive pattern according to an exemplary embodiment, the second insulating layer 23 can have excellent film uniformity because the conductive pattern has a gentle taper angle.

The second insulating layer 23 may include a contact hole for transmitting a signal to the first gate conductive layer. When forming the contact hole, layers may be over-etched to some extent. If the first gate conductive layer has the structure of the conductive pattern according to the exemplary embodiments, the surface of the main conductive layer can be protected due to the capping layer, and thus, deterioration of electrical characteristics of the first gate conductive layer can be prevented.

The second gate conductive layer is disposed on the second insulating layer 23. The second gate conductive layer may include a second electrode CSE of the storage capacitor Cst. The second gate conductive layer may have the structure of a conductive pattern according to the exemplary embodiments. That is, the second gate conductive layer may include a main conductive layer and a capping layer.

The third insulating layer 24 is disposed on the second gate conductive layer. When the second gate conductive layer is formed as the conductive pattern according to an exemplary embodiment, the third insulating layer 24 can have excellent film uniformity because the conductive pattern has a gentle taper angle.

The first source/drain conductive layer is disposed on the third insulating layer 24. The first source/drain conductive layer may include a source electrode SE, a drain electrode DE, and a first power supply voltage electrode ELVDDE of the thin film transistor. The source electrode SE and drain electrode DE of the thin film transistor may be electrically connected to the source region and drain region of the semiconductor layer PS through the contact hole penetrating the third insulating layer 24, the second insulating layer 23, and the first insulating layer 22. The first source/drain conductive layer may also have the structure of a conductive pattern according to exemplary embodiments.

The fourth insulating layer 25 is disposed on the first source/drain conductive layer.

The second source/drain conductive layer is disposed on the fourth insulating layer 25. The second source/drain conductive layer may include a data signal line DL, a connection electrode CE, and a first power supply voltage line ELVDDL.

The data signal line DL may be electrically connected to the source electrode SE of the thin film transistor through the contact hole penetrating the fourth insulating layer 25. The connection electrode CE may be electrically connected to the drain electrode DE of the thin film transistor through the contact hole penetrating the fourth insulating layer 25. The first power supply voltage line ELVDDL may be electrically connected to the first power supply voltage electrode ELVDDE through the contact hole penetrating the fourth insulating layer 25.

As such, the fourth insulating layer 25 includes a plurality of contact holes for exposing the first source/drain conductive layer. When the first source/drain conductive layer is formed as the conductive pattern according to the exemplary embodiments, the surface of the main conductive layer can be protected due to the capping layer, and thus, deterioration of the electrical characteristics of the second source/drain conductive layer can be prevented.

The fifth insulating layer 26 is disposed on the second source/drain conductive layer.

The anode electrode ANO is disposed on the fifth insulating layer 26. The anode electrode ANO may be electrically connected to the connection electrode CE through a contact hole penetrating the fifth insulating layer 26, and may be connected to the drain electrode DE of the thin film transistor through the contact hole.

As such, the fifth insulating layer 26 includes a contact hole for exposing the second source/drain conductive layer. When the second source/drain conductive layer is formed as the conductive pattern according to the exemplary embodiment, the surface of the main conductive layer can be protected due to the capping layer, and thus, deterioration of the electrical characteristics of the second source/drain conductive layer can be prevented.

A pixel defining layer 27 may be disposed on the anode electrode ANO. The pixel defining layer 27 may include an opening for exposing the anode electrode ANO.

The organic layer EL is disposed in the opening of the pixel defining layer 27. The organic layer EL may include an organic light emitting layer EL1, a hole injection/transport layer EL2, and an electron injection/transport layer EL3. Although FIG. 17 shows that the hole injection/transport layer EL2 and the electron injection/transport layer EL3 are each formed as a single layer, however, the inventive concepts are not limited thereto, and these layers may include a plurality of injection layers and a plurality of transport layers laminated with each other, respectively.

The cathode electrode CAT is disposed on the organic layer EL and the pixel defining layer 27. The cathode electrode CAT may be a common electrode disposed over a plurality of pixels.

As described above, when the organic light emitting diode display device 10 includes the conductive pattern according to exemplary embodiments, signal delay may be significantly reduced due to the low resistance while having excellent film quality, thereby improving display quality.

As described above, a conductive pattern constructed according to the principles of the invention is capable of preventing damage to the conductive pattern having a subsequent process and improve the reliability of the conductive pattern, while using a low resistance material such as aluminum or an aluminum alloy as the material of the main conductive layer.

Further, a film disposed on the conductive pattern according to exemplary embodiments may have improved uniformity due to gentle taper angle of the conductive pattern.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A conductive pattern for a display device, comprising:
a first layer comprising aluminum or an aluminum alloy disposed on a substrate and forming a first taper angle with the substrate; and
a second layer disposed on the first layer and forming a second taper angle with the first layer, the second layer has a thickness of at least about 800 Å and includes:
a first component layer disposed on the first layer and comprising at least one of titanium nitride and tantalum;
a second component layer disposed on the first component layer and comprising titanium;
a third component layer disposed on the second component layer comprising at least one of titanium nitride and tantalum; and
a fourth component layer disposed on the third component layer and comprising titanium,
wherein the second taper angle is smaller than the first taper angle, and
wherein an atomic ratio of nitrogen to titanium in the first component layer is substantially uniform along a thickness direction.

2. The conductive pattern of claim 1, wherein:
the first component layer has a thickness in a range of about 150 Å to about 400 Å; and
each of the second component layer, the third component layer, and the fourth component layer has a thickness in a range of about 50 Å to about 200 Å.

3. The conductive pattern of claim 1, wherein the second layer further comprises a fifth component layer disposed on the fourth component layer and comprising titanium nitride.

4. The conductive pattern of claim 3, wherein a thickness the fifth component layer is less than a thickness of each of the first to fourth component layers.

5. The conductive pattern of claim 1, wherein an atomic ratio of nitrogen to titanium of the first component layer is in a range of about 0.9 to about 1.2.

6. The conductive pattern of claim 1, wherein:
the first layer comprises a plurality of sequentially laminated component layers; and
a taper angle of each of the component layers is substantially the same or progressively decreases in a direction away from the first layer.

7. The conductive pattern of claim 1, wherein the taper angle of the first layer is less than about 60°.

8. The conductive pattern of claim 7, wherein the taper angle of the second layer is less than about 50°.

9. The conductive pattern of claim 1, wherein:
the first layer comprises a conductive layer; and
the second layer comprises a capping layer.

10. The conductive pattern of claim 1, wherein at least one of the first and second component layers includes a tip or undercut portion at a side portion thereof.

11. A display device, comprising:
a substrate;
a thin film transistor disposed on the substrate; and
a conductive pattern connected to the thin film transistor and comprising:
a first layer comprising aluminum or an aluminum alloy and forming a first taper angle with the substrate; and
a second layer disposed on the first layer, forming a second taper angle smaller than the first taper angle, having a thickness of at least about 800 Å, and including:
a first component layer disposed on the first layer and comprising titanium nitride;

a second component layer disposed on the first component layer and comprising titanium;

a third component layer disposed on the second component layer and comprising titanium nitride; and a fourth component layer disposed on the third component layer and comprising titanium, wherein an atomic ratio of nitrogen to titanium in the first component layer is substantially uniform along a thickness direction.

12. The display device of claim 11, wherein:

the first component layer has a thickness in a range of about 150 Å to about 400 Å; and each of the second component layer, the third component layer, and the fourth component layer has a thickness in a range of about 50 Å to about 200 Å.

13. The display device of claim 11, wherein the first taper angle is less than about 60°, and the second taper angle is less than about 50°.

14. The display device of claim 11, wherein the conductive pattern comprises at least one of a scan signal line to transmit a scan signal to the thin film transistor and a data signal line to transmit a data signal to the thin film transistor.

15. A method of manufacturing a conductive pattern for a display device, the method comprising the steps of:

forming a conductive layer comprising aluminum or an aluminum alloy;

forming a capping layer on the conductive layer;

forming a photoresist pattern on the capping layer;

etching the capping layer and the conductive layer under a first condition using a first etchant; and etching the capping layer and the conductive layer under a second condition using a second etchant, wherein:

the first condition has a higher etching rate for the capping layer and the conductive layer than the second condition, and a lower consumption rate for the photoresist pattern than the second condition;

each of the first etchant and the second etchant comprises nitrogen; and the amount of nitrogen in the first etchant is less than that in the second etchant.

16. The method of claim 15, wherein each of the first etchant and the second etchant further comprises chlorine and boron chloride.

17. The method of claim 16, wherein:

the amount of chlorine in the first etchant is greater than that in the second etchant; and the amount of boron chloride in the first etchant is less than that in the second etchant.

18. The method of claim 15, wherein the step of forming the capping layer further comprises the steps of:

forming a first layer comprising titanium nitride on the conductive layer; and forming a second layer comprising titanium on the first layer.

19. The method of claim 18, wherein the step of forming the first layer and the step of forming the second layer are continuously performed in the same sputtering apparatus.

* * * * *